(12) United States Patent
Meloche et al.

(10) Patent No.: US 10,205,409 B1
(45) Date of Patent: Feb. 12, 2019

(54) POWER GENERATING TILE ASSEMBLY

(71) Applicants: Joseph L. Meloche, Rochester Hills, MI (US); Heather S. Meloche, Rochester Hills, MI (US)

(72) Inventors: Joseph L. Meloche, Rochester Hills, MI (US); Heather S. Meloche, Rochester Hills, MI (US)

( * ) Notice: Subject to any disclaimer, the term of this patent is extended or adjusted under 35 U.S.C. 154(b) by 296 days.

(21) Appl. No.: 15/230,551

(22) Filed: Aug. 8, 2016

Related U.S. Application Data (60) Provisional application No. 62/211,933, filed on Aug. 31, 2015.

(51) Int. Cl.
| | |
|---|---|
| H01L 41/113 | (2006.01) |
| H02N 2/18 | (2006.01) |
| H01L 41/04 | (2006.01) |
| H01L 41/053 | (2006.01) |
| H01L 41/047 | (2006.01) |
| H02K 35/04 | (2006.01) |
| H01L 41/083 | (2006.01) |

(52) U.S. Cl.
CPC ............ H02N 2/186 (2013.01); H01L 41/042 (2013.01); H01L 41/0475 (2013.01); H01L 41/053 (2013.01); H01L 41/113 (2013.01); H02K 35/04 (2013.01); H01L 41/083 (2013.01)

(58) Field of Classification Search
CPC ............... H01L 41/113; H01L 41/1132; H01L 41/1134; H01L 41/1136; H01L 41/1138
USPC ......................................................... 310/339
See application file for complete search history.

(56) References Cited

U.S. PATENT DOCUMENTS

| | | | |
|---|---|---|---|
| 2007/0188053 A1* | 8/2007 | Stark ...................... | B60C 23/041 310/339 |
| 2008/0146890 A1* | 6/2008 | LeBoeuf .............. | A61B 5/0059 600/300 |
| 2011/0156532 A1* | 6/2011 | Churchill ................ | H01L 27/20 310/319 |
| 2016/0164390 A1* | 6/2016 | Furukawa .............. | H02K 35/02 310/339 |

* cited by examiner

*Primary Examiner* — Derek Rosenau
(74) *Attorney, Agent, or Firm* — Buckert Patent & Trademark Law Firm PC; John F. Buckert (57) ABSTRACT

A power generating tile assembly includes a tile cover plate that is coupled to a rigid base plate to define an interior region therebetween. The tile cover plate vibrates in response to either sounds waves contacting the tile cover plate or an external force being applied to the tile cover plate. The power generating tile assembly includes a vibrationally-activated power generating device that is coupled to the tile cover plate within the interior region. The vibrationally-activated power generating device generates a first voltage in response to vibrations in the tile cover plate.

13 Claims, 7 Drawing Sheets

POWER GENERATING TILE ASSEMBLY

CROSS-REFERENCE TO RELATED APPLICATION

This application claims priority to U.S. Provisional Patent Application No. 62/211,933 filed on Aug. 31, 2015, the entire contents of which are hereby incorporated by reference herein.

BACKGROUND

The inventors herein have recognized a need for a power generating tile assembly that generates electrical power in response to either sound waves or external forces contacting the assembly.

SUMMARY

A power generating tile assembly in accordance with an exemplary embodiment is provided. The power generating tile assembly includes a rigid base plate. The power generating tile assembly further includes a tile cover plate that is coupled to the rigid base plate. The tile cover plate and the rigid base plate define an interior region therebetween. The tile cover plate vibrates in response to either sounds waves contacting the tile cover plate or an external force being applied to the tile cover plate. The power generating tile assembly further includes a vibrationally-activated power generating device that is coupled to the tile cover plate within the interior region. The vibrationally-activated power generating device generates a first voltage in response to vibrations in the tile cover plate.

DETAILED DESCRIPTION

First Embodiment

Referring to FIGS. 1-4, a power generating tile assembly 20 in accordance with an exemplary embodiment is provided. The power generating tile assembly 20 includes a rigid base plate 30, a tile cover plate 32, a vibrationally-activated power generation device 36, an energy harvesting circuit 38, batteries 40, 42, electrical conductors 50, 52, and electrical connectors 60, 62, 70, 72, 80, 82, 90, 92. An advantage of the power generating tile assembly 20 is that the assembly 20 generates a DC voltage in response to either sounds waves contacting the tile cover plate 32 or an external oscillatory force being applied substantially perpendicular to a top surface 122 of the tile cover plate 32.

The rigid base plate 30 is coupled to be adhered to a floor structure or a wall structure. The rigid base plate 30 includes a bottom surface 110, a top surface 112, first and second side surfaces 113, 114, and third and fourth side surfaces (not shown). The bottom surface 110 extends substantially parallel to and away from the top surface 112. The first side surface 114 extends between the top surface 112 and the bottom surface 110 and extends substantially parallel to the second side surface 114. The second side surface 113 extends between the top surface 112 and the bottom surface 110, and extends substantially parallel to the first side surface 113. In an exemplary embodiment, the rigid base plate 30 is substantially rectangular-shaped. Of course, in an alternative embodiment, the rigid base plate 30 could be constructed in other shapes such as a circular shape, an oval-shape, or a triangular shape for example. Further, in an exemplary embodiment, the rigid base plate 30 is constructed of ceramic. However, in an alternative embodiment, the rigid base plate 30 could be constructed of other materials such as a plastic or a metal for example.

Figure 1:
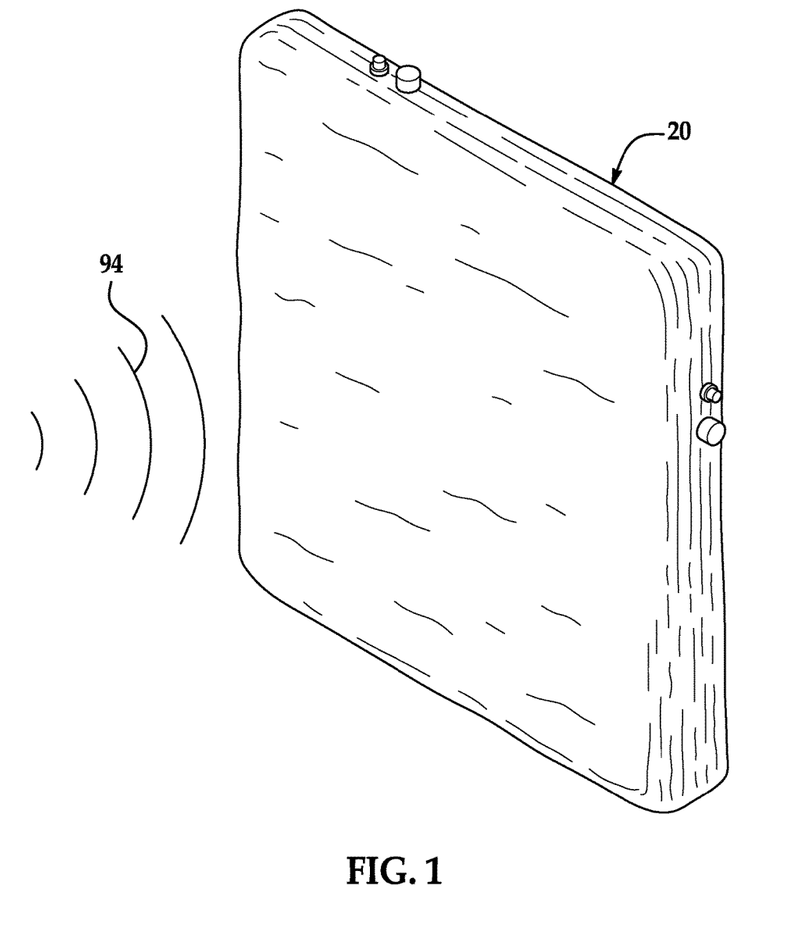
FIG. 1 is a schematic of a power generating tile assembly in accordance with a first exemplary embodiment.
Figure 2:
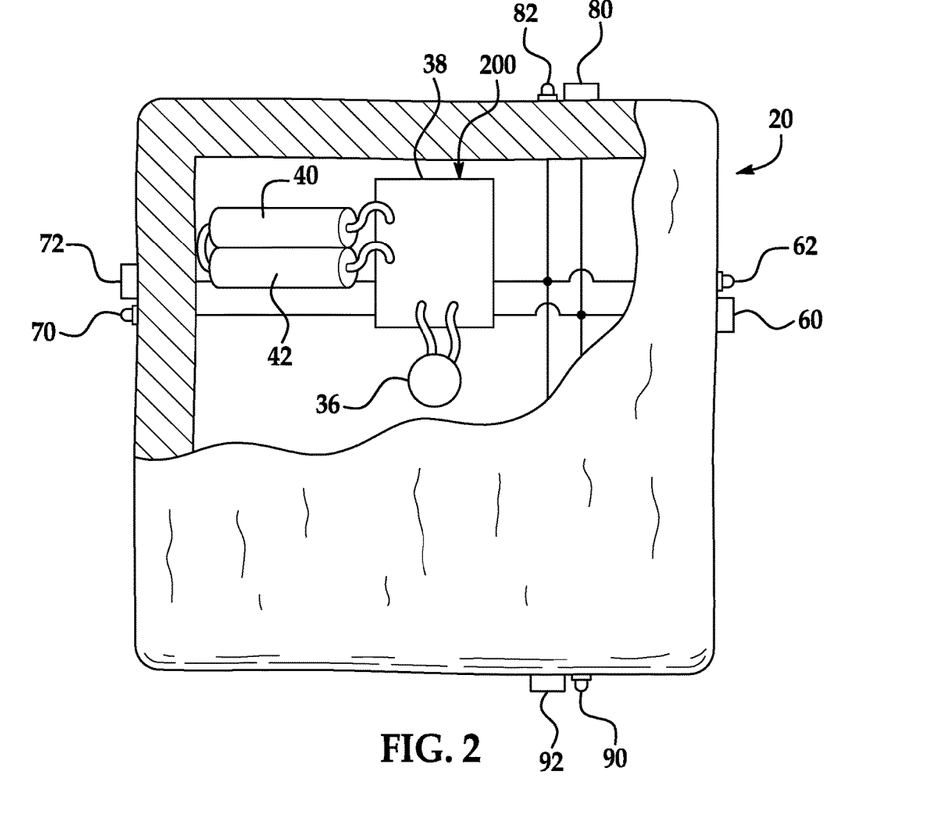
FIG. 2 is another schematic of the power generating tile assembly of FIG. 1 with a portion of a tile cover plate removed therefrom.
Figure 3:
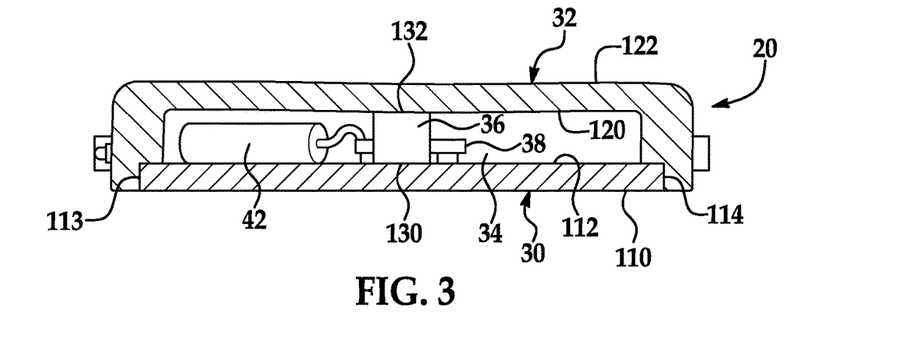
FIG. 3 is a cross-sectional schematic of a portion of the power generating tile assembly of FIG. 1.
Figure 4:
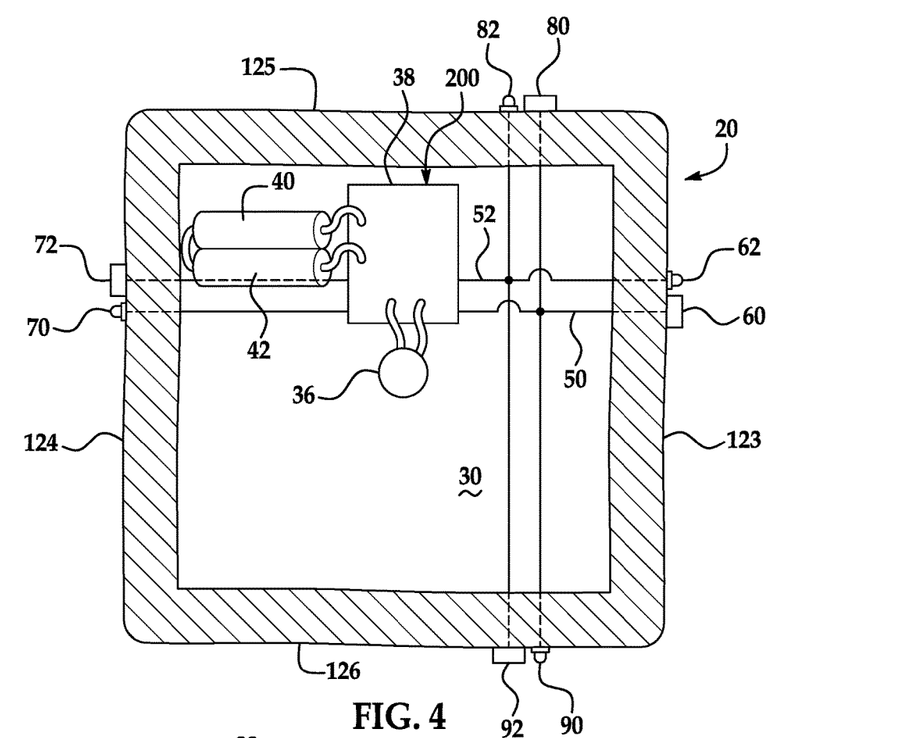
FIG. 4 is a schematic of the power generating tile assembly of FIG. 1 with a portion a tile cover plate removed therefrom.

Referring to FIGS. 3 and 4, the tile cover plate 32 is coupled to the rigid base plate 30 such that the top cover plate 32 and the rigid base plate 30 define an enclosed interior region 34 therebetween. The tile cover plate 32 includes a bottom surface 120, a top surface 122, and side surfaces 123, 124, 125, 126. The tile cover plate 32 contacts a peripheral region of the top surface 112, the first side surface 113, the second side surface 114, and the third and fourth side surfaces (not shown) of the rigid base plate 30, when the tile cover plate 32 is coupled to the rigid base plate 30. In an exemplary embodiment, the tile cover plate 32 is constructed of ceramic. However, in an alternative embodiment the tile cover plate 32 could be constructed of other materials such as a plastic or a metal for example. Further, in an exemplary embodiment, the top surface 122 is a textured top surface. The tile cover plate 32 is adapted to vibrate in response to either sound waves 94 contacting the tile cover plate 32 or an external oscillatory force being applied to the tile cover plate 32.

Referring to FIG. 3, the vibrationally-activated power generating device 36 is coupled to the tile cover plate 32 within the interior region 34. The vibrationally-activated power generating device 36 generates a first voltage in response to vibrations in the tile cover plate 32. In an exemplary embodiment, the vibrationally-activated power generating device 36 is a piezoelectric device having a first end 130 and a second end 132. The first end 130 is coupled to and abuts against the top surface 112 of the rigid base plate 30. In an exemplary embodiment, the first end 130 is adhesively bonded to the top surface 112 of the rigid base plate 30. Further, the second end 132 is coupled to and abuts against the bottom surface 120 of the tile cover plate 32. In an exemplary embodiment, the second end 132 is adhesively bonded to the bottom surface 120 of the tile cover plate 32. The vibrationally-activated power generating device 36 is electrically coupled to the energy harvesting circuit 38 which receives the first voltage from the device 36.

Figure 5:
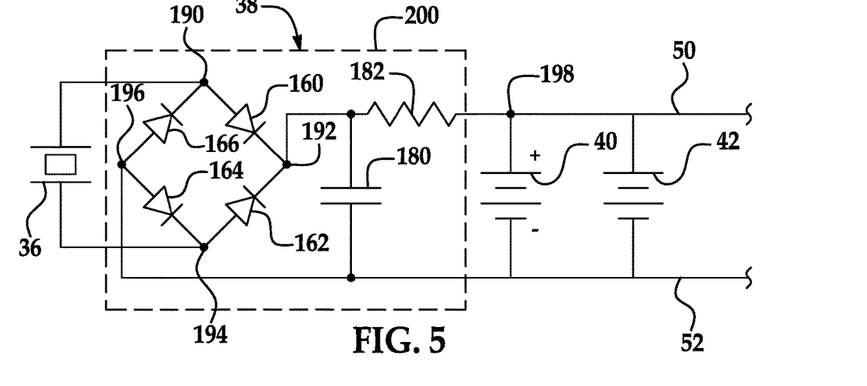
FIG. 5 is a schematic of an energy harvesting circuit utilized in the power generating tile assembly of FIG. 1.

Referring to FIGS. 3 and 5, the energy harvesting circuit 38 is electrically coupled to the vibrationally-activated power generating device 36 and is disposed within the interior region 34. The energy harvesting circuit 38 receives the first voltage (e.g., high-frequency voltage) from the vibrationally-activated power generating device 36 and outputs a DC voltage in response to receiving the first voltage. In an exemplary embodiment, the energy harvesting circuit 38 is a full wave rectifier which includes diodes 160, 162, 164, 166, a capacitor 180, a resistor 182, electrical nodes 190, 192, 194, 196, 198, and a circuit board 200. The circuit board 200 holds the diodes 160, 162, 164, 166, the capacitor 180, and the resistor 182 thereon. The circuit board 200 is mounted to the top surface 112 of the rigid base plate 30 utilizing circuit board standoffs. The piezo-electric device 36 is electrically coupled between the electrical nodes 190, 194. The diode 160 is electrically coupled between the electrical nodes 190, 192, and the diode 162 is electrically coupled between the electrical nodes 194, 192. Further, the diode 164 is electrically coupled between the electrical nodes 196, 194, and the diode 166 is electrically coupled between the electrical nodes 196, 190. The capacitor 180 is electrically coupled between the electrical nodes 192, 196. Finally, the resistor 182 is electrically coupled between the electrical node 192 and the electrical node 198.

During operation, when the tile cover plate 32 vibrates in response to either sound waves 94 contacting the tile cover plate 32 or an external oscillatory force being applied to the tile cover plate 32, the vibrationally-activated power generating device 36 generates a first voltage (e.g. high-frequency voltage) that is received by the energy harvesting circuit 38. In response, the energy harvesting circuit 38 generates a DC voltage between the electrical nodes 198, 196 which is received by the batteries 40, 42 for charging the batteries 40, 42. Further, the DC voltage is applied between the electrical conductors 50, 52.

Referring to FIGS. 3-5, the batteries 40, 42 are disposed within the interior region 34. The batteries 40, 42 are both electrically coupled to the energy harvesting circuit 38 and receive the DC voltage from the circuit 38. In particular, the battery 40 is electrically coupled between the electrical nodes 198, 196, and the battery 42 is electrically coupled between the electrical nodes 198, 196 in parallel with the battery 40.

Referring to FIGS. 4 and 5, the electrical conductor 50 is coupled to and extends from the electrical node 198 and is electrically coupled to the electrical connectors 60, 70, 80, 90. The electrical conductor 52 is coupled to and extends from the electrical node 196 and is electrically coupled to the electrical connectors 62, 72, 82, 92.

Referring to FIG. 4, the electrical connectors 60, 62 are coupled to and extend outwardly from the side surface 123 of the tile cover plate 32. The electrical connectors 60, 62 are electrically coupled to the electrical conductors 50, 52, respectively. The electrical connectors 60, 62 supply the DC voltage from the energy harvesting circuit 38 (and the batteries 40, 42) to either an external device (not shown) or another power generating tile assembly (not shown) coupled to the electrical connectors 60, 62. The electrical connector 62 is a male electrical connector, and the electrical connector 60 is a female electrical connector. The female electrical connector 60 is adapted to be removably coupled to another male electrical connector (having a similar structure as the male electrical connector 62) on an adjacent power generating tile assembly (not shown).

The electrical connectors 70, 72 are coupled to and extend outwardly from the side surface 124 of the tile cover plate 32. The electrical connectors 70, 72 are electrically coupled to the electrical conductors 50, 52, respectively. The electrical connectors 70, 72 supply the DC voltage from the energy harvesting circuit 38 (and the batteries 40, 42) to either an external device (not shown) or another power generating tile assembly (not shown) coupled to the electrical connectors 70, 72. The electrical connector 70 is a male electrical connector, and the electrical connector 72 is a female electrical connector. The female electrical connector 72 is adapted to be removably coupled to another male electrical connector (having a similar structure as the male electrical connector 70) on an adjacent power generating tile assembly (not shown).

The electrical connectors 80, 82 are coupled to and extend outwardly from the side surface 125 of the tile cover plate 32. The electrical connectors 80, 82 are electrically coupled to the electrical conductors 50, 52, respectively. The electrical connectors 80, 82 supply the DC voltage from the energy harvesting circuit 38 (and the batteries 40, 42) to either an external device (not shown) or another power generating tile assembly (not shown) coupled to the electrical connectors 80, 82. The electrical connector 82 is a male electrical connector, and the electrical connector 80 is a female electrical connector. The female electrical connector 80 is adapted to be removably coupled to another male electrical connector (having a similar structure as the male electrical connector 82) on an adjacent power generating tile assembly (not shown).

The electrical connectors 90, 92 are coupled to and extend outwardly from the side surface 126 of the tile cover plate 32. The electrical connectors 90, 92 are electrically coupled to the electrical conductors 50, 52, respectively. The electrical connectors 90, 92 supply the DC voltage from the energy harvesting circuit 38 (and the batteries 40, 42) to either an external device (not shown) or another power generating tile assembly (not shown) coupled to the electrical connectors 90, 92. The electrical connector 90 is a male electrical connector, and the electrical connector 92 is a female electrical connector. The female electrical connector 92 is adapted to be removably coupled to another male electrical connector (having a similar structure as the male electrical connector 90) on an adjacent power generating tile assembly (not shown)

Second Embodiment

Figure 6:
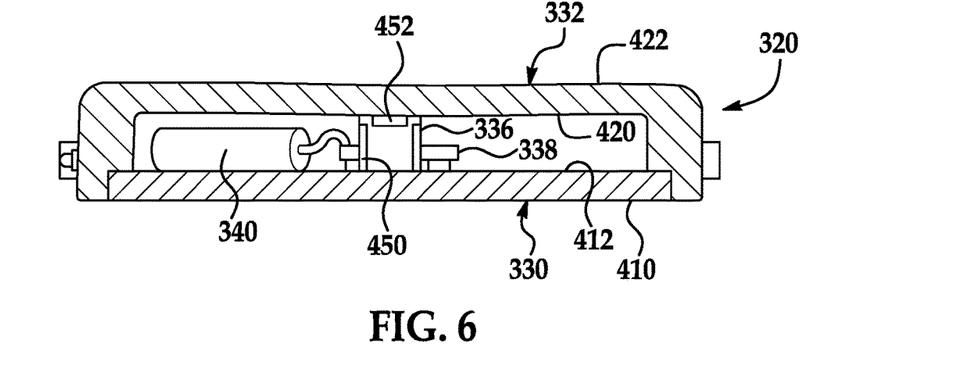
FIG. 6 is a cross-sectional schematic of a power generating tile assembly in accordance with a second exemplary embodiment.

Referring to FIG. 6, a power generating tile assembly 320 in accordance with another exemplary embodiment is provided. The power generating tile assembly 320 includes a rigid base plate 330, a tile cover plate 332, a vibrationally-activated power generation device 336, an energy harvesting circuit 338, a battery 340, and another battery (not shown).

The components of power generating tile assembly 320 are substantially similar to the components of the power generating tile assembly 20 except that the vibrationally-activated power generation device 336 is different than the vibrationally-activated power generation device 36 as will be explained in greater detail below.

The rigid base plate 330 has a structure that is identical to the structure of the rigid base plate 30, and includes a bottom surface 410 and a top surface 412. Further, the tile cover plate 332 has a structure that is identical to the structure of the tile cover plate 32 and includes a bottom surface 420 and a top surface 422. Further, the energy harvesting circuit 338 has a structure that is identical to the structure of the energy harvesting circuit 38. Further, the power generating tile assembly 320 has electrical conductors and electrical connectors that are identical to those of the assembly 20.

The vibrationally-activated power generation device 36 includes an electrical coil 450 and a magnet 452. The electrical coil 450 is coupled to the top surface 412 of the rigid base plate 330. The magnet 452 is coupled to the bottom surface 420 of the tile cover plate 332. During operation, when the tile cover plate 332 vibrates in response to either sound waves contacting the tile cover plate 332 or an external oscillatory force being applied to the tile cover plate 332, the magnet 452 moves upwardly and downwardly which induces the electrical coil 450 to generate a first voltage (e.g. high-frequency voltage) that is received by the energy harvesting circuit 338. In response, the energy harvesting circuit 338 generates a DC voltage which is applied to the internal batteries, and is further applied to the electrical connectors of the assembly 320.

Third Embodiment

Figure 7:
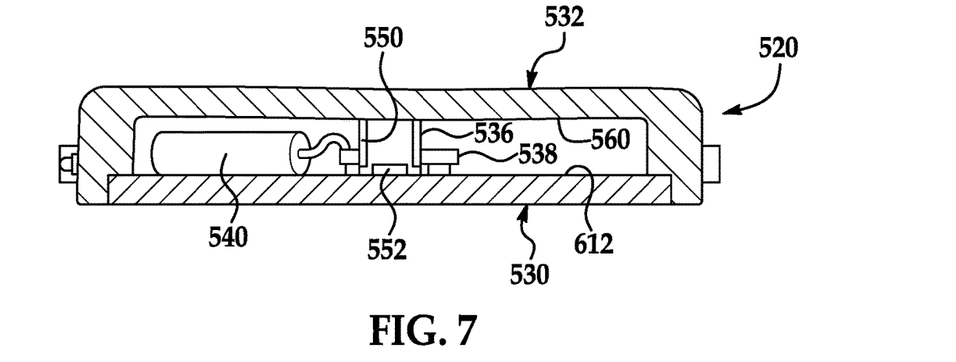
FIG. 7 is a cross-sectional schematic of a power generating tile assembly in accordance with a third exemplary embodiment.

Referring to FIG. 7, a power generating tile assembly 520 in accordance with another exemplary embodiment is provided. The power generating tile assembly 520 includes a rigid base plate 530, a tile cover plate 532, a vibrationally-activated power generation device 536, an energy harvesting circuit 538, a battery 540, and another battery (not shown).

The components of power generating tile assembly 520 are substantially similar to the components of the power generating tile assembly 20 except that the vibrationally-activated power generation device 536 is different than the vibrationally-activated power generation device 36 as will be explained in greater detail below.

The rigid base plate 530 has a structure that is identical to the structure of the rigid base plate 30. Further, the tile cover plate 532 has a structure that is identical to the structure of the tile cover plate 32. Further, the energy harvesting circuit 538 has a structure that is identical to the structure of the energy harvesting circuit 38. Further, the power generating tile assembly 520 has electrical conductors and electrical connectors that are identical to those of the assembly 20.

The vibrationally-activated power generation device 536 includes an electrical coil 550 and a magnet 552. The electrical coil 550 is coupled to the bottom surface 560 of the top cover plate 532. The magnet 552 is coupled to a top surface 612 of the rigid base plate 530. During operation, when the tile cover plate 532 vibrates in response to either sound waves contacting the tile cover plate 532 or an external oscillatory force being applied to the tile cover plate 532, the electrical coil 550 moves upwardly and downwardly relative to the magnet 552 which induces the electrical coil 550 to generate a first voltage (e.g. high-frequency voltage) that is received by the energy harvesting circuit 538. In response, the energy harvesting circuit 538 generates a DC voltage which is applied to the internal batteries, and is further applied to the electrical connectors of the assembly 520.

Fourth Embodiment

Referring to FIGS. 8-11, a power generating tile assembly 620 in accordance with another exemplary embodiment is provided. The power generating tile assembly 620 includes a rigid base plate 630, a tile cover plate 632, a vibrationally-activated power generation device 636, an energy harvesting circuit 638, a batteries 640, 642, electrical conductors 650, 652, electrical connectors 660, 662, 670, 672, 680, 682, 690, 692.

Figure 8:
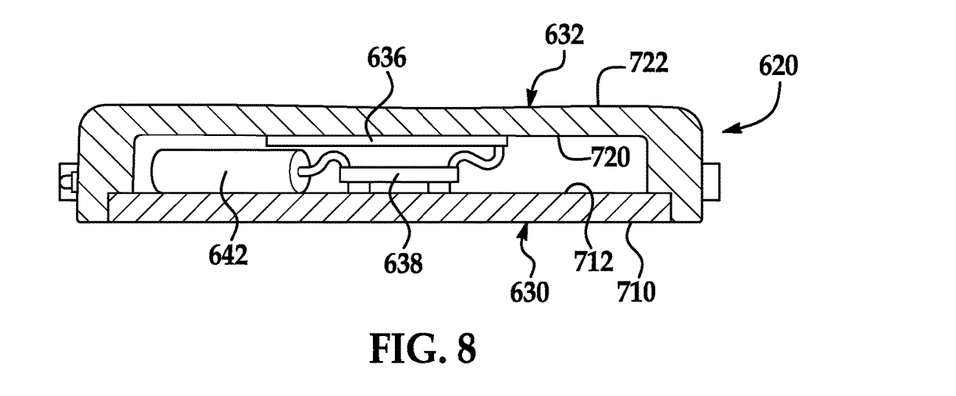
FIG. 8 is a cross-sectional schematic of a power generating tile assembly in accordance with a fourth exemplary embodiment.

The components of power generating tile assembly 620 are substantially similar to the components of the power generating tile assembly 20 except that the vibrationally-activated power generation device 636 is different than the vibrationally-activated power generation device 36 as will be explained in greater detail below.

The rigid base plate 630 has a structure that is identical to the structure of the rigid base plate 30. Further, the tile cover plate 632 has a structure that is identical to the structure of the tile cover plate 32. Further, the energy harvesting circuit 638 has a structure that is identical to the structure of the energy harvesting circuit 38. The batteries 640, 642 have a structure that are identical to the structure of the batteries 40, 42, respectively. The electrical conductors 650, 652 have a structure that are identical to the structure of the electrical conductors 50, 52, respectively. Further, the electrical connectors 660, 662, 670, 672, 680, 682, 690, 692 have a structure that are identical to the structure of the electrical connectors 60, 62, 70, 72, 80, 82, 90, 92, respectively.

Figure 9:
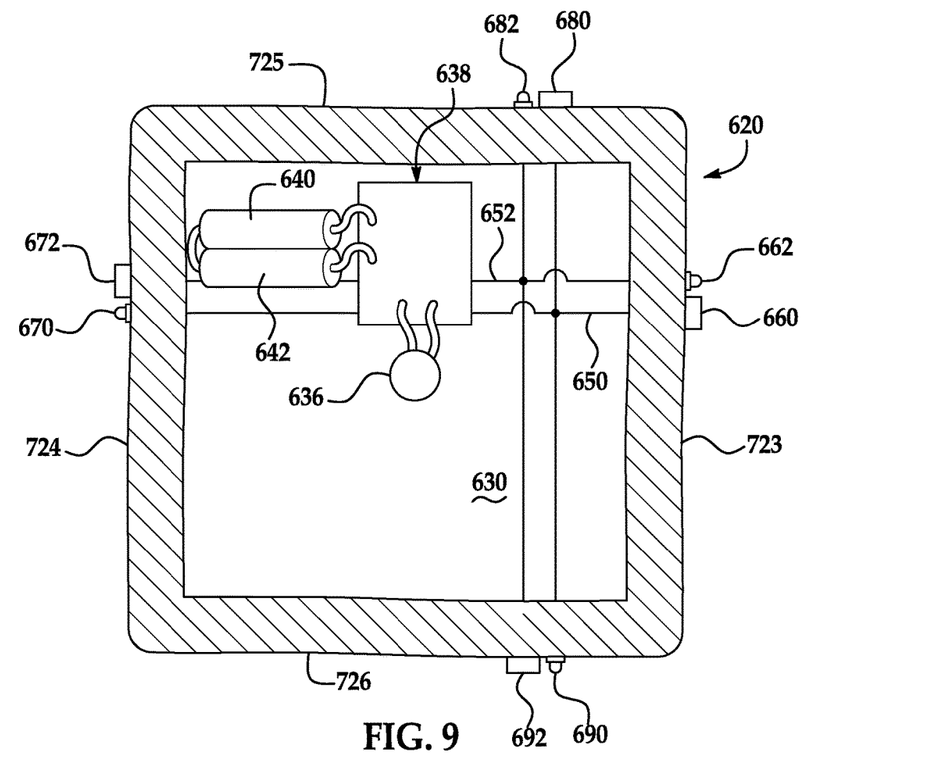
FIG. 9 is a schematic of the power generating tile assembly of FIG. 8 with a portion of a tile cover plate removed therefrom.

The rigid base plate 630 includes a bottom surface 710 and a top surface 712. Further, the tile cover plate 632 includes a bottom surface 720, a top surface 722, and side surfaces 723, 724, 725, 726.

Figure 10:
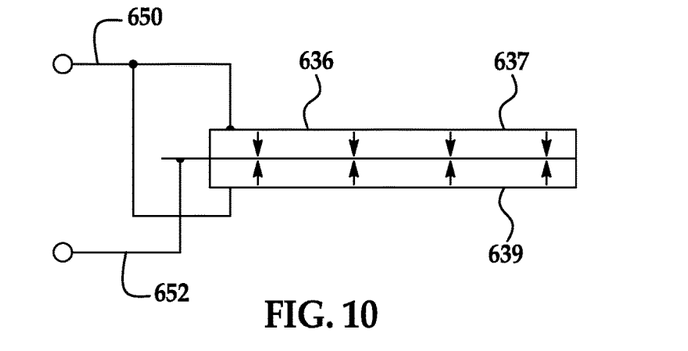
FIG. 10 is a schematic of a vibrationally-activated power generating device utilized in the power generating tile assembly of FIG. 8.

The vibrationally-activated power generating device 636 is a bimorph device having piezo-electric layers 637, 639 coupled to one another. The vibrationally-activated power generating device 636 is coupled to the bottom surface 720 of the tile cover plate 632. During operation, when the tile cover plate 632 vibrates in response to either sound waves contacting the tile cover plate 632 or an external oscillatory force being applied to the tile cover plate 632, the bimorph device 636 generates a first voltage (e.g. high-frequency voltage) that is received by the energy harvesting circuit 638. In response, the energy harvesting circuit 638 generates a DC voltage which is applied to the batteries 640, 642, and is further applied to the electrical connectors of the assembly 620.

Fifth Embodiment

Figure 11:
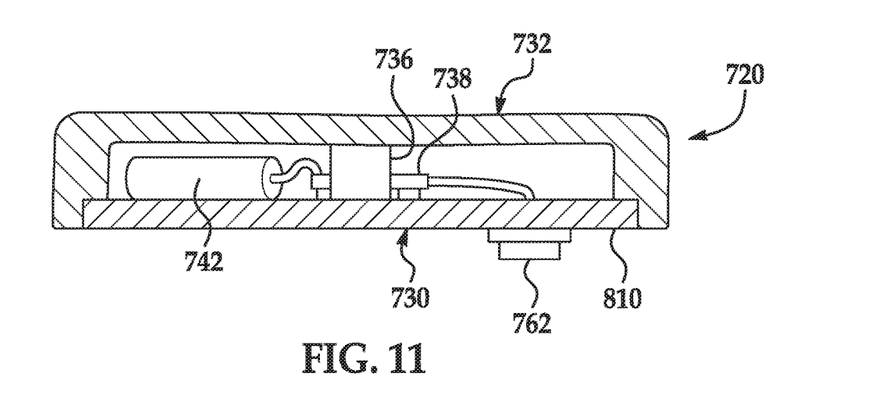
FIG. 11 is a cross-sectional schematic of a power generating tile assembly in accordance with a fifth exemplary embodiment.
Figure 12:
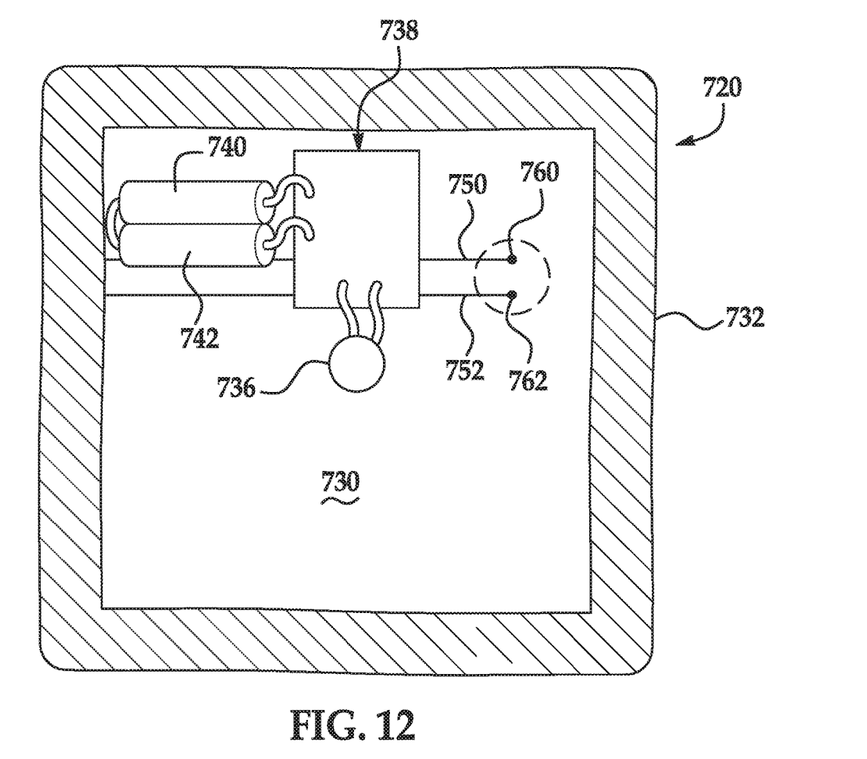
FIG. 12 is a schematic of the power generating tile assembly of FIG. 11 with a portion of a tile cover plate removed therefrom.

Referring to FIGS. 11 and 12, a power generating tile assembly 720 in accordance with another exemplary embodiment is provided. The power generating tile assembly 720 includes a rigid base plate 730, a tile cover plate 732, a vibrationally-activated power generation device 736, an energy harvesting circuit 738, batteries, 740, 742, electrical conductors 750, 752, and electrical connectors 760, 762.

The primary difference between the power generating tile assembly 720 and the power generating tile assembly 20 is that the assembly 720 utilizes electrical connectors 760, 762 that extend downwardly from a bottom surface 810 of the rigid base plate 730, instead of extending outwardly from a side surface of the tile cover plate.

Regarding similarities, the rigid base plate 730 has a structure that is identical to the structure of the rigid base plate 30. Further, the tile cover plate 732 has a structure that is identical to the structure of the tile cover plate 32. Further, the vibrationally-activated power generation device 736 has a structure that is identical to the structure of the vibrationally-activated power generation device 36. Further, the energy harvesting circuit 738 has a structure that is identical to the structure of the energy harvesting circuit 38.

During operation, when the tile cover plate 732 vibrates in response to either sound waves contacting the tile cover plate 732 or an external oscillatory force being applied to the tile cover plate 732, the vibrationally-activated power generating device 736 generates a first voltage (e.g. high-frequency voltage) that is received by the energy harvesting circuit 738. In response, the energy harvesting circuit 738 generates a DC voltage which is received by the batteries 740, 742 for charging the batteries 740, 742. Further, the DC voltage is applied between the electrical conductors 750, 752, and further between the electrical connectors 760, 762.

Sixth Embodiment

Figure 13:
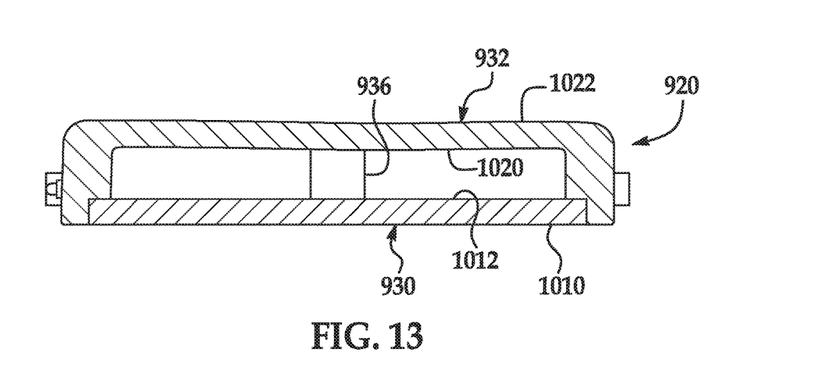
FIG. 13 is a cross-sectional schematic of a power generating tile assembly in accordance with a sixth exemplary embodiment.
Figure 14:
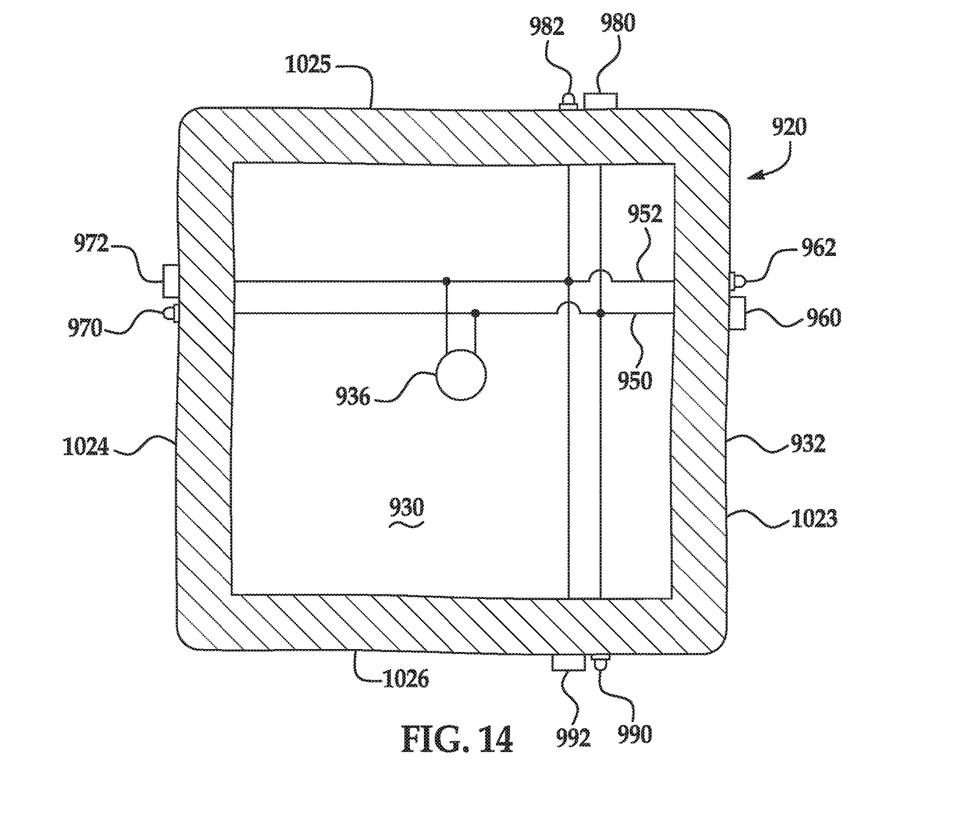
FIG. 14 is a schematic of the power generating tile assembly of FIG. 13 with a portion of a tile cover plate removed therefrom.

Referring to FIGS. 13 and 14, a power generating tile assembly 920 in accordance with another exemplary embodiment is provided. The power generating tile assembly 920 includes a rigid base plate 930, a tile cover plate 932, a vibrationally-activated power generation device 936, electrical conductors 950, 952, and electrical connectors 960, 962, 970, 972, 980, 982, 990, 992.

The primary difference between the power generating tile assembly 920 and the power generating tile assembly 20 is that the assembly 920 does not have an energy harvesting circuit or batteries. In other words, the power generating tile assembly 920 outlets a first voltage (e.g. a high-frequency voltage) directly to the electrical connectors 960-992.

Regarding similarities, the rigid base plate 930 has a structure that is identical to the structure of the rigid base plate 30. Further, the tile cover plate 932 has a structure that is identical to the structure of the tile cover plate 32. Further, the vibrationally-activated power generation device 936 has a structure that is identical to the structure of the vibrationally-activated power generation device 36.

The rigid base plate 930 includes a bottom surface 1010 and a top surface 1012. Further, the tile cover plate 932 includes a bottom surface 1020, a top surface 1022, and side surfaces 1023, 1024, 1025, 1026.

During operation, when the tile cover plate 932 vibrates in response to either sound waves contacting the tile cover plate 932 or an external oscillatory force being applied to the tile cover plate 932, the vibrationally-activated power generating device 936 generates a first voltage (e.g. high-frequency voltage) that is applied between the electrical conductors 950, 952. Further, the first voltage is applied between the electrical connectors 960, 962, and between the electrical connectors 970, 972. Still further, the first voltage is applied between the electrical connectors 980, 982, and between the electrical connectors 990, 992.

The power generating tile assemblies provide a substantial advantage over other devices for generating electrical power. In particular, power generating tile assemblies generates a DC voltage or a high frequency voltage in response to sounds waves contacting a tile cover plate. Further, the power generating tile assemblies have electrical connectors for connecting several such assemblies in a grid configuration for increasing an amount of generated electrical power.

While the claimed invention has been described in detail in connection with only a limited number of embodiments, it should be readily understood that the invention is not limited to such disclosed embodiments. Rather, the claimed invention can be modified to incorporate any number of variations, alterations, substitutions or equivalent arrangements not heretofore described, but which are commensurate with the spirit and scope of the invention. Additionally, while various embodiments of the claimed invention have been described, it is to be understood that aspects of the invention may include only some of the described embodiments. Accordingly, the claimed invention is not to be seen as limited by the foregoing description.

What is claimed is:

1. A power generating tile assembly, comprising:
a floor-mountable rigid base plate sized and shaped to be coupled to a floor structure;
a tile cover plate being coupled to the floor-mountable rigid base plate and directly contacting the floor-mountable rigid base plate, the tile cover plate and the floor-mountable rigid base plate defining an interior region therebetween; the tile cover plate vibrating in response to either sounds waves contacting the tile cover plate or an external force being applied to the tile cover plate;
a vibrationally-activated piezoelectric device being coupled to the tile cover plate within the interior region; the vibrationally-activated piezoelectric device generating a first voltage in response to vibrations in the tile cover plate;
an energy harvesting circuit being electrically coupled to the vibrationally-activated piezoelectric device and being disposed within the interior region, the energy harvesting circuit receiving the first voltage from the vibrationally-activated piezoelectric device and outputting a DC voltage in response to receiving the first voltage; and
a first electrical connector that receives the DC voltage from the vibrationally-activated piezoelectric device; the first electrical connector extending outwardly from an external surface of the power generating tile assembly.

2. The power generating tile assembly of claim 1, further comprising:
a battery being disposed within the interior region, the battery being electrically coupled to the energy harvesting circuit and receiving the DC voltage.

3. The power generating tile assembly of claim 2, further comprising second, third and fourth electrical connectors; wherein the second, third and fourth electrical connectors being coupled to and extending outwardly from first, second and third side surfaces, respectively, of the tile cover plate, the external surface being a fourth side surface of the tile cover plate.

4. The power generating tile assembly of claim 2, wherein the external surface is a bottom surface of the floor-mountable rigid base plate.

5. The power generating tile assembly of claim 1, wherein the floor-mountable rigid base plate is constructed of ceramic.

6. The power generating tile assembly of claim 1, wherein the tile cover plate is constructed of ceramic and has a textured outer surface.

7. A power generating tile assembly, comprising:
a rigid base plate;

a tile cover plate being coupled to the rigid base plate, the tile cover plate and the rigid base plate defining an interior region therebetween; the tile cover plate vibrating in response to either sounds waves contacting the tile cover plate or an external force being applied to the tile cover plate;

a vibrationally-activated power generating device being coupled to the tile cover plate within the interior region; the vibrationally-activated power generating device generating a first voltage in response to vibrations in the tile cover plate;

an energy harvesting circuit being electrically coupled to the vibrationally-activated power generating device and being disposed within the interior region, the energy harvesting circuit receiving the first voltage from the vibrationally-activated power generating device and outputting a DC voltage in response to receiving the first voltage;

a battery being disposed within the interior region, the battery being electrically coupled to the energy harvesting circuit and receiving the DC voltage;

a first electrical connector being coupled to one of the rigid base plate and the tile cover plate, the first electrical connector being electrically coupled to the battery; the first electrical connector being coupled to and extending outwardly from a first side surface of the tile cover plate; and second, third and fourth electrical connectors; the second, third and fourth electrical connectors being coupled to and extending outwardly from second, third, and fourth side surfaces, respectively, of the tile cover plate.

8. The power generating tile assembly of claim 7, wherein the vibrationally-activated power generating device comprises a piezoelectric device.

9. The power generating tile assembly of claim 7, wherein the vibrationally-activated power generating device includes a movable coil and a magnet.

10. The power generating tile assembly of claim 9, wherein the movable coil being coupled to the rigid base plate, the movable coil being electrically coupled to the energy harvesting circuit, and the magnet being coupled to the tile cover plate proximate to the movable coil.

11. The power generating tile assembly of claim 9, wherein the magnet being coupled to the rigid base plate, the movable coil being electrically coupled to the energy harvesting circuit, and the movable coil being coupled to the tile cover plate proximate to the magnet.

12. The power generating tile assembly of claim 7, wherein the tile cover plate is constructed of ceramic, and has a textured outer surface.

13. A power generating tile assembly, comprising:
a floor-mountable rigid base plate sized and shaped to be coupled to a floor structure;

a ceramic tile cover plate being coupled to the floor-mountable rigid base plate and directly contacting the floor-mountable rigid base plate, the ceramic tile cover plate and the floor-mountable rigid base plate defining an interior region therebetween; the ceramic tile cover plate vibrating in response to either sounds waves contacting the ceramic tile cover plate or an external force being applied to the ceramic tile cover plate;

a vibrationally-activated piezoelectric device being coupled to the ceramic tile cover plate within the interior region; the vibrationally-activated piezoelectric device generating a first voltage in response to vibrations in the ceramic tile cover plate;

an energy harvesting circuit being electrically coupled to the vibrationally-activated piezoelectric device and being disposed within the interior region, the energy harvesting circuit receiving the first voltage from the vibrationally-activated piezoelectric device and outputting a DC voltage in response to receiving the first voltage; and a first electrical connector that receives the DC voltage from the vibrationally-activated piezoelectric device; the first electrical connector extending outwardly from an external surface of the power generating tile assembly.

\* \* \* \* \*